(12) United States Patent
Xiao

(10) Patent No.: US 9,728,504 B2
(45) Date of Patent: Aug. 8, 2017

(54) INTERCONNECT STRUCTURES AND FABRICATION METHOD THEREOF

(71) Applicant: Semiconductor Manufacturing International (Shanghai) Corporation, Shanghai (CN)

(72) Inventor: Deyuan Xiao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/671,358

(22) Filed: Mar. 27, 2015

(65) Prior Publication Data
US 2015/0348911 A1    Dec. 3, 2015

(30) Foreign Application Priority Data
May 28, 2014   (CN) .......................... 2014 1 0230783

(51) Int. Cl.
| | |
|---|---|
| H01L 21/28 | (2006.01) |
| H01L 23/532 | (2006.01) |
| H01L 23/522 | (2006.01) |
| H01L 21/768 | (2006.01) |
| H01L 21/288 | (2006.01) |

(52) U.S. Cl.
CPC .. *H01L 23/53276* (2013.01); *H01L 21/76876* (2013.01); *H01L 21/76885* (2013.01); *H01L 23/5226* (2013.01); *H01L 23/5329* (2013.01); H01L 21/288 (2013.01); H01L 2221/1094 (2013.01); H01L 2924/0002 (2013.01)

(58) Field of Classification Search
CPC .......... H01L 21/28562; H01L 21/0276; H01L 23/53276
See application file for complete search history.

(56) References Cited

U.S. PATENT DOCUMENTS

| | | | |
|---|---|---|---|
| 2002/0112814 A1* | 8/2002 | Hafner | B82Y 10/00 156/272.2 |
| 2006/0222780 A1* | 10/2006 | Gurevich | B22F 1/0018 427/569 |
| 2006/0292861 A1* | 12/2006 | Furukawa | B82Y 10/00 438/627 |

(Continued)

*Primary Examiner* — Marc Armand
*Assistant Examiner* — Sarah Salerno
(74) *Attorney, Agent, or Firm* — Anova Law Group, PLLC

(57) ABSTRACT

A method is provided for fabricating an interconnect structure. The method includes providing a substrate; and forming a first conductive layer; and forming a sacrificial layer on the substrate and the first conductive layer. The method also includes forming an opening exposing a surface of the first conductive layer in the sacrificial layer; and forming a catalyst layer on the exposed portion of the surface of the first conductive layer and a top surface of the sacrificial layer. Further, the method includes forming carbon nanotube bundles perpendicular to the surface of the substrate on the catalyst layer; and removing the sacrificial layer and the carbon bundles on the sacrificial layer. Further, the method also includes forming a first dielectric material layer covering top surfaces of the carbon nanotube bundles and a portion the surface of the substrate without carbon nanotubes to seal the carbon nanotube bundles in a space.

17 Claims, 9 Drawing Sheets

(56) References Cited

U.S. PATENT DOCUMENTS

2008/0237858 A1* 10/2008 Nihei ............... H01L 21/76831
  257/746
2010/0132771 A1*  6/2010 Lu .......................... B82Y 10/00
  136/252

* cited by examiner

INTERCONNECT STRUCTURES AND FABRICATION METHOD THEREOF

CROSS-REFERENCES TO RELATED APPLICATIONS

This application claims the priority of Chinese patent application No. 201410230783.2, filed on May 28, 2014, the entirety of which is incorporated herein by reference.

FIELD OF THE INVENTION

The present invention generally relates to the field of semiconductor manufacturing technology and, more particularly, relates to interconnect structures and fabrication techniques thereof.

BACKGROUND

With the repaid development of the semiconductor technology, the integration level of the ultra large-integration (ULI) has been progressed into a scale with millions and billions devices in a chip; and the multiple-layer metal interconnect technique which utilizes two or more layers of metal interconnect structures has been widely used. Currently, the conventional metal interconnect structures are made of aluminum. However, with the continuous decreasing of the feature size of the semiconductor devices in the integrated circuits, the circuit density of the metal interconnect lines has been continuously increased, the required response time has been continuously decreased. Thus, the conventional aluminum interconnect lines are often unable to match the requirements.

When the feature size of the semiconductor devices enters into a scale of 130 nm or below, the Cu interconnect technique has been used to substitute the convention Al interconnect technique. However, when the feature size of the semiconductor device is further miniaturized, the electrical current carried by the interconnect lines has become larger and larger, and it has almost reached the limitation of the Cu interconnect lines. Further, the surface scattering and the crystal boundary scattering of the Cu interconnect lines have become more and more intense; and the resistance of the Cu interconnect lines is increased. Thus, the reliability of the Cu interconnect structures is reduced. Therefore, it may need to look for a novel material to substitute Cu to increase the reliability of the metal interconnect structures.

Carbon nanotubes have a plurality of advantages, and they are well proved to be the novel interconnect material to substitute the Cu interconnect structures. Carbon nanotubes have a significantly high thermal conductivity. Thus, they favor the dissipation of heat. Further, the transport mode of the carriers in a carbon nanotube is a ballistic transport mode, the transport of the carriers in the carbon nanotube may barely be affected by the scattering effect. Thus, carbon nanotubes may carry a significantly large current density. Further, carbon nanotubes also have a significantly large mechanical strength and thermal stability, and a substantially low power consumption, etc.

It may be difficult to form carbon nanotubes along a lateral direction, thus the carbon nanotubes used as a part of an interconnect structure are commonly grown in a vertical through hole. However, the reliability of the interconnect structures using carbon nanotubes needs further improvements. The disclosed device structures and methods are directed to solve one or more problems set forth above and other problems

BRIEF SUMMARY OF THE DISCLOSURE

One aspect of the present disclosure includes a method for fabricating a semiconductor structure. The method includes providing a substrate; and forming a first conductive layer with a surface leveling with a surface of the substrate in the substrate; and forming a sacrificial layer on the surfaces of the substrate and the first conductive layer. The method also includes forming an opening exposing a portion of the surface of the first conductive layer in the sacrificial layer; and forming a catalyst layer on the exposed portion of the surface of the first conductive layer and a top surface of the sacrificial layer. Further, the method includes forming a carbon nanotube bundle perpendicular to the surface of the substrate on the catalyst layer; and removing the sacrificial layer and the carbon bundles on the sacrificial layer simultaneously to leave the carbon nanotube bundle formed within the opening. Further, the method also includes forming a first dielectric material layer covering a top surface of the carbon nanotube bundle formed within the opening and a portion the surface of the substrate without carbon nanotubes to seal the carbon nanotube bundles in a space; and performing a planarization process on the first dielectric material layer using the top surfaces of the carbon nanotube bundles as a stop to form a first dielectric layer with a top surface leveling with the top surfaces of the carbon nanotube bundles. Further, the method also includes forming a second dielectric layer on the top surfaces of the carbon nanotube bundles and the top surface of the first dielectric layer; and forming a second conductive layer electrically connecting with the top surface of the carbon nanotube bundles in the second dielectric layer.

Another aspect of the present disclosure includes a semiconductor structure. The semiconductor structure includes a substrate having a first conductive layer with a surface leveling with a surface of the substrate. The semiconductor structure also includes a carbon nanotube bundle perpendicular to the surface of the substrate formed on the surface of the first conductive layer. Further, the semiconductor structure includes a first dielectric material layer covering the surface of the substrate and the carbon nanotube bundle to seal the carbon nanotube bundles in a space.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
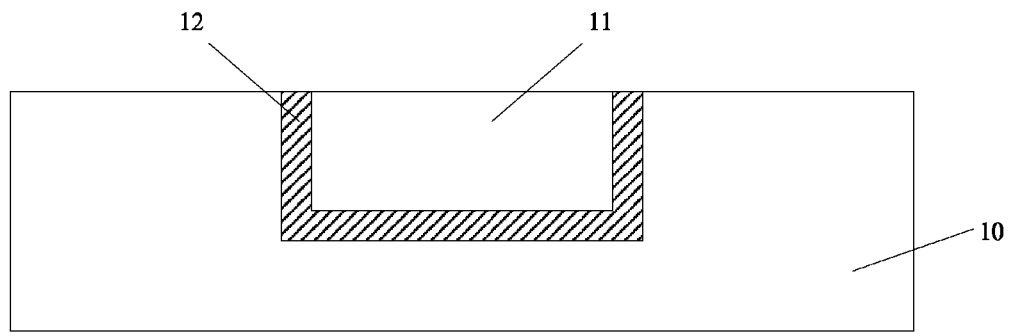
FIGS. 1~5 illustrate semiconductor structures corresponding to certain stages of an existing fabrication process of a carbon nanotube interconnect structure.

FIGS. 1~5 illustrate semiconductor structures corresponding to certain stages of an existing fabrication process of a carbon nanotube interconnect structure. As shown in FIG. 1, at the beginning of the fabrication method, a substrate 10 is provided. A first conductive layer 11 is formed in the semiconductor substrate 10; and a first diffusion barrier layer 12 is formed between the substrate 10 and the first conductive layer 11. The first diffusion barrier layer 12 is used to prevent the metallic atoms of the first conductive layer 11 from diffusing into the substrate 10.

Figure 2:
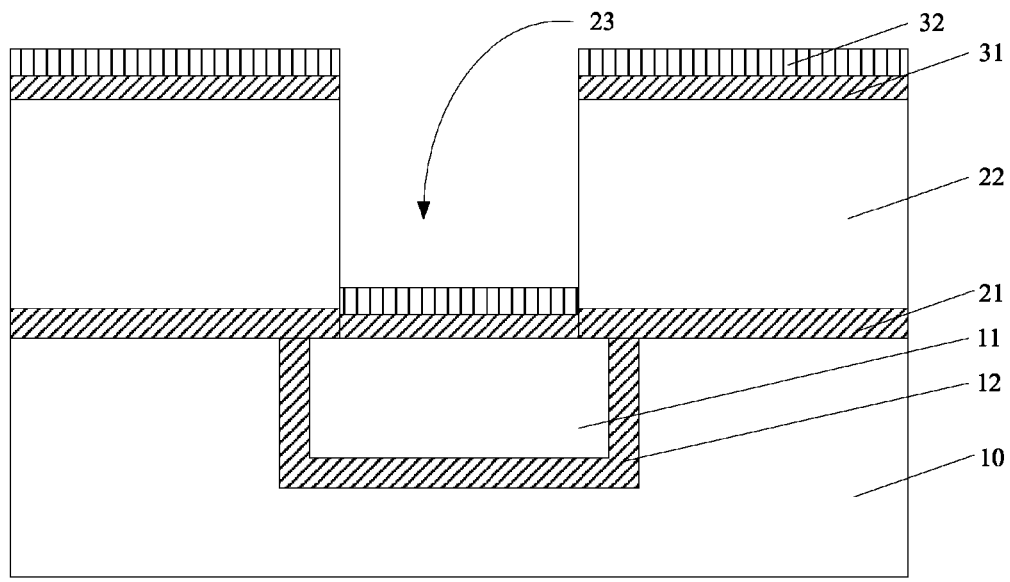

Further, as shown in FIG. 2, after forming the first conductive layer 11, a first barrier layer 21 is formed on the surface of the substrate 10 and the surface of the first conductive layer 11; and a first dielectric layer 22 having a through hole 23 is formed on the surface of the first barrier layer 21. The through hole 23 exposes a portion of the surface of the first conductive layer 11. Further, a second diffusion barrier layer 31 is formed on the surface of first conductive layer 11 exposed by the through hole 23 and the surface of the first dielectric layer 22; and an electrical contact layer 32 is formed on the surface of the second diffusion barrier layer 31.

Figure 3:
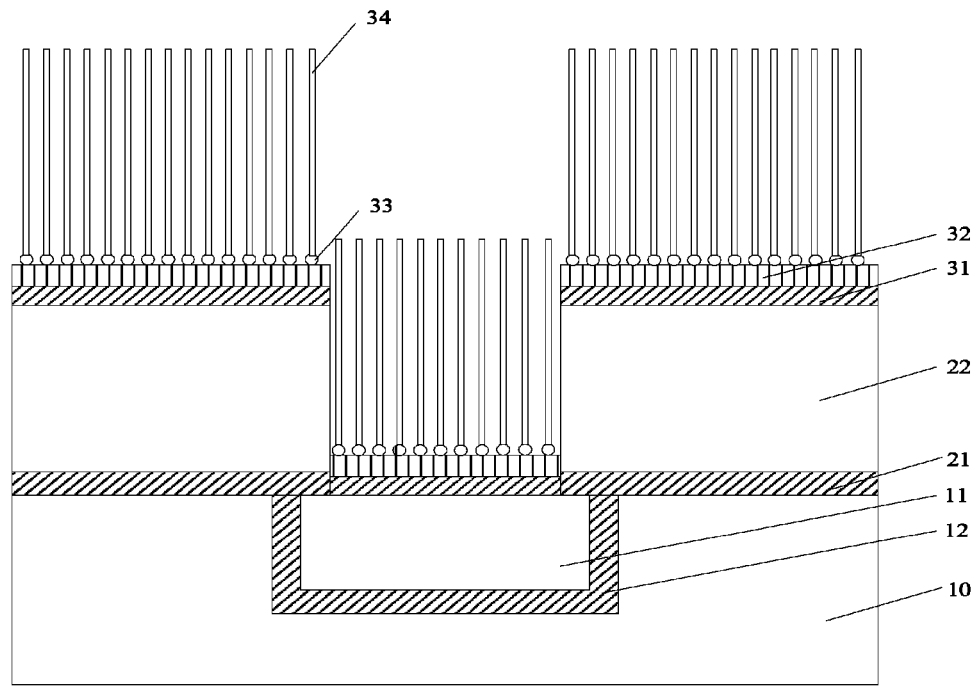

Further, as shown FIG. 3, after forming the electrical contact layer 32, a metal nanoparticle layer 33 is formed on the surface the electrical contact layer 32. Then, carbon nanotubes 34 are formed on the metal nanoparticle layer 33.

Figure 4:
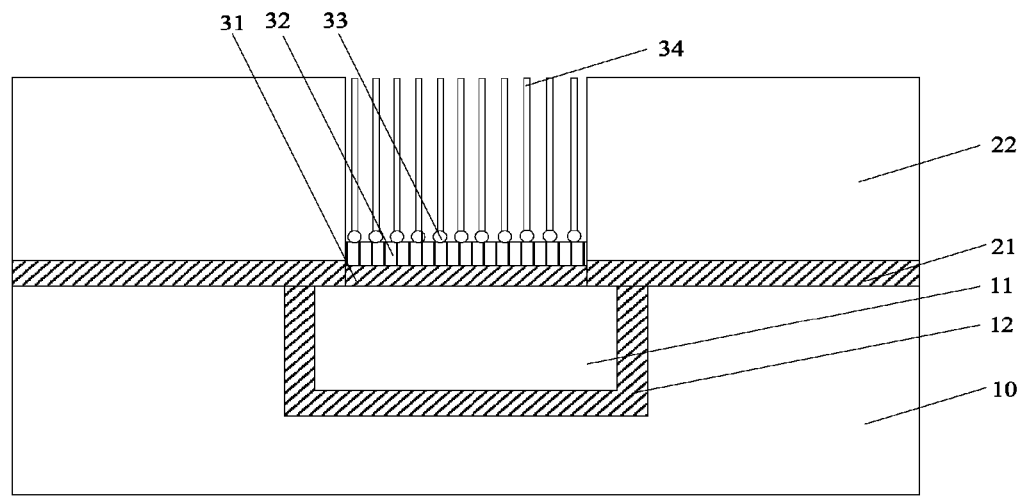

Further, as shown in FIG. 4, a planarization process using a chemical mechanical polishing (CMP) process is performed using the first dielectric layer 22 as a stop layer. The second barrier layer 31, the electrical contact layer 32, the metal nanoparticle layer 33, and a portion of the carbon nanotubes 34 on the surface of the first dielectric layer 22 are removed by the CMP process. The top surfaces of the carbon nanotubes 34 level with the surface of the first dielectric layer 22 after the CMP process.

Figure 5:
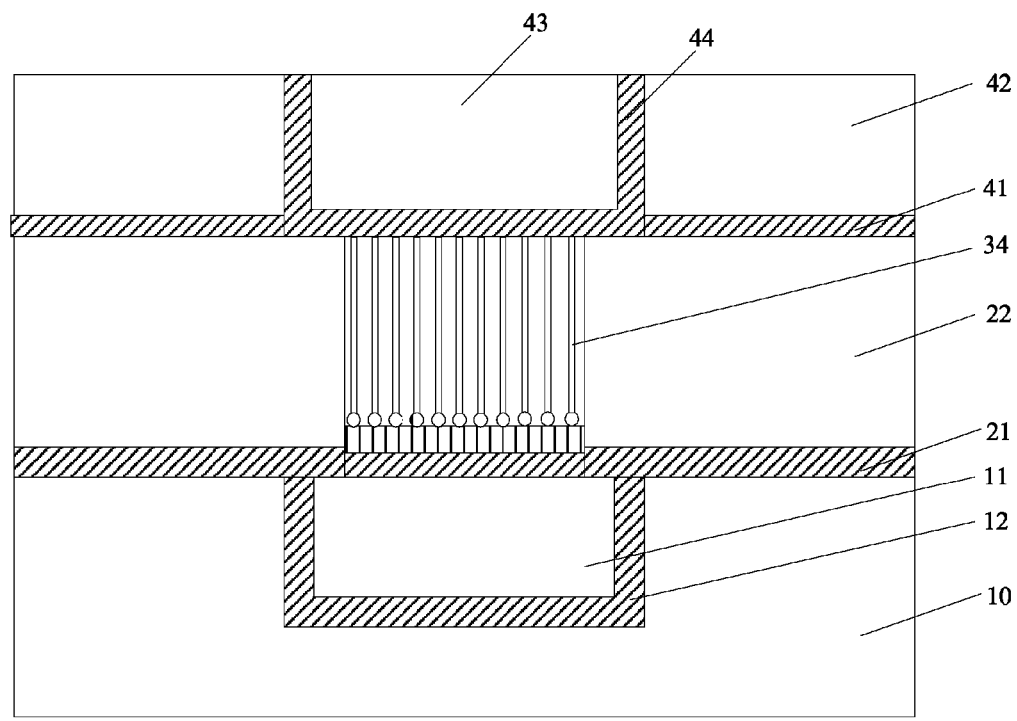

Further, as shown in FIG. 5, after the CMP process, a second barrier layer 41 having an opening (not labeled) is formed on the top surface of the first dielectric layer 22 and the top surfaces of the carbon nanotubes 34. The opening exposes the top surfaces of the carbon nanotubes 34. Further, a third diffusion barrier layer 44 is formed on the inner side surface of the opening, and a second conductive layer 43 is formed on the surface of the third diffusion barrier layer 44. The second conductive layer 43 fills the opening.

As described above, in order to cause the surfaces of the carbon nanotubes 34 in the through hole 23 to level with the surface of the first dielectric layer 22, it may need the top surfaces of the initially formed carbon nanotubes 34 to be higher than the surface of the first dielectric layer 22; and the planarization process may be performed. The planarization process may also need to be performed onto the carbon nanotubes 34 formed on the surface of the first dielectric layer 22. Thus, the time of the planarization process may be significantly long. During the planarization process, a large quantity of polishing slurry may enter into the through hole 23; and the residual contaminations in the through hole 23 may be difficult to remove.

Thus, the performance of the interconnect structure may be affected. Further, during the planarization process on the carbon nanotubes 34 in the through hole 23, because the mechanical strength of the carbon nanotubes 34 may be significantly large, the bottom of carbon nanotubes 34 may be peeled off from the electrical contact layer 32 under the effect of the polishing force of the CMP process. Thus, the electrical interconnect performance between the carbon nanotubes 34 and the electrical contact layer 32 may be affected; and the performance of the interconnect structure may be affected as well.

Figure 15:
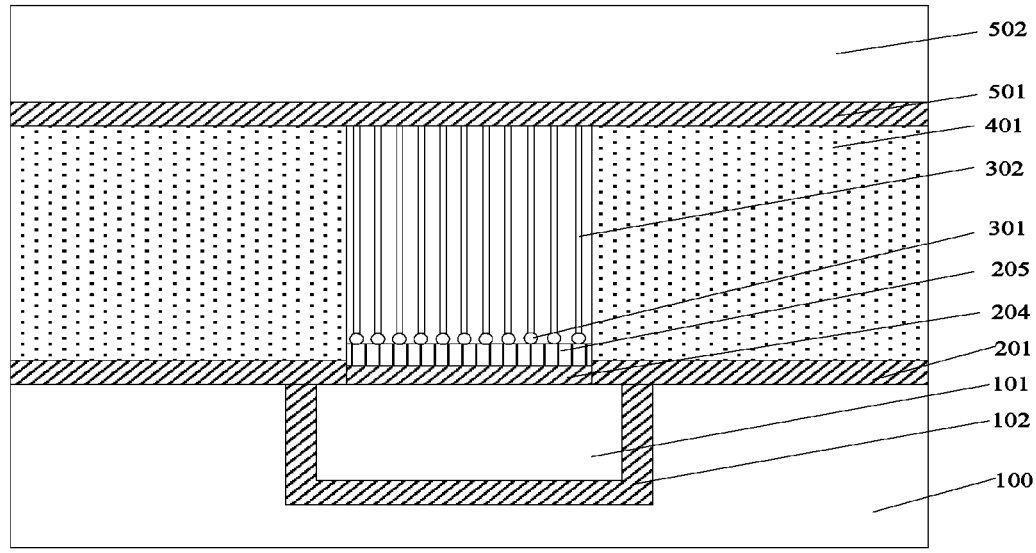
Figure 16:
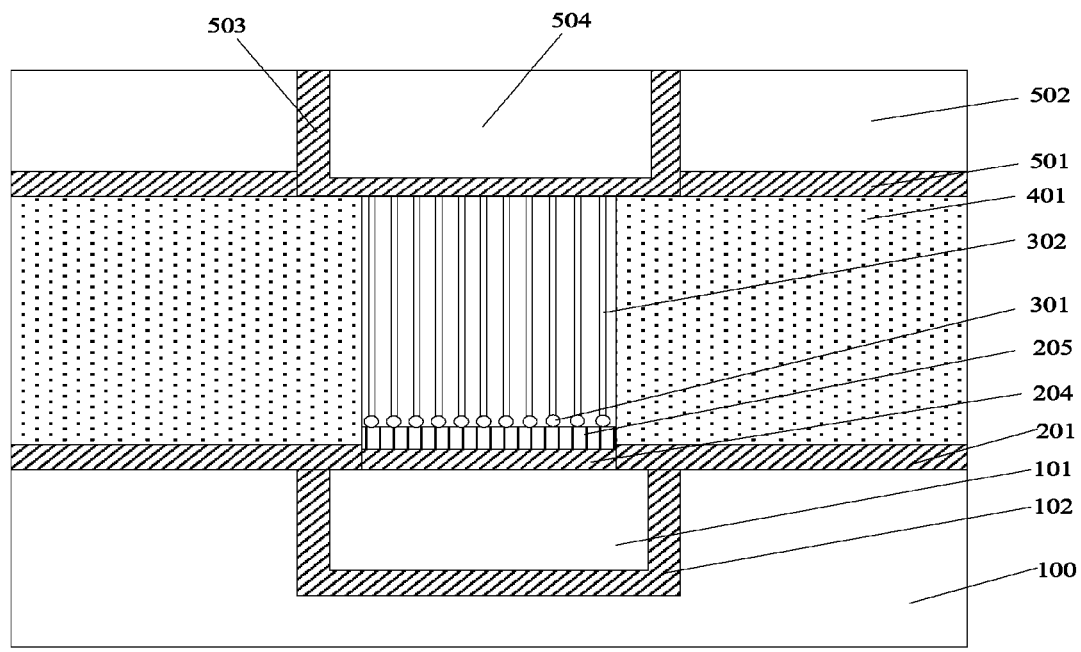
Figure 17:
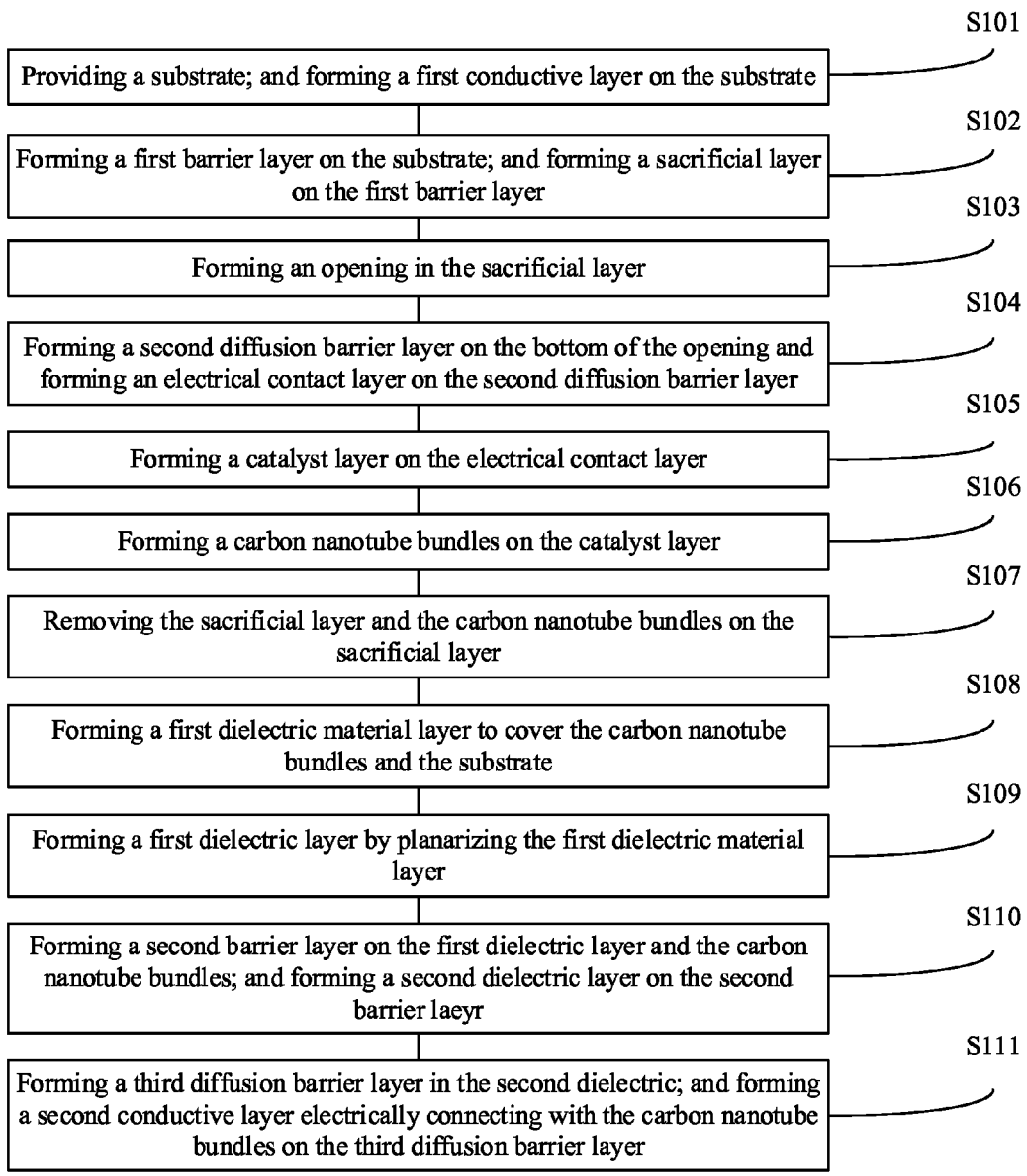
FIG. 17 illustrates an exemplary fabrication process of an interconnect structure consistent with the disclosed embodiments.

FIG. 17 illustrates an exemplary fabrication process of an interconnect structure consistent with the disclosed embodiments; and FIGS. 6~16 illustrate semiconductor structures corresponding to certain stages of the exemplary fabrication process consistent with the disclosed embodiments.

Figure 6:
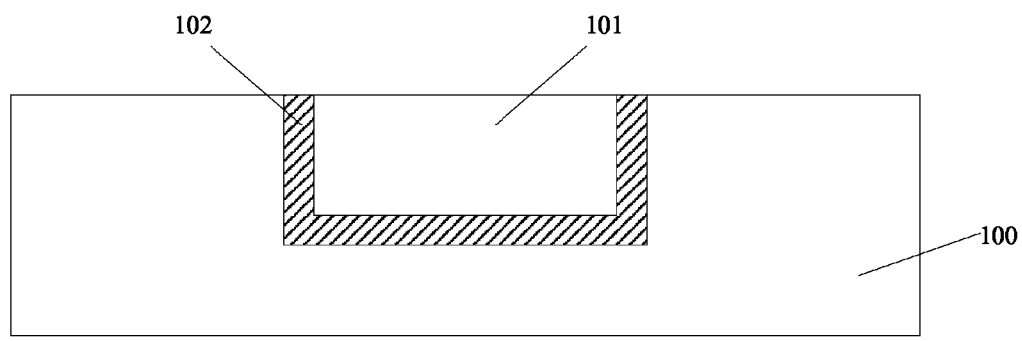
FIGS. 6~16 illustrate semiconductor structures corresponding to certain stages of a fabrication process of an interconnect structure consistent with the disclosed embodiments.

As shown in FIG. 17, at the beginning of the fabrication process, a substrate with certain structures is provided (S101). FIG. 6 illustrates a corresponding semiconductor structure.

As shown in FIG. 6, a substrate 100 is provided. The substrate 100 may include a semiconductor substrate (not labeled), an insulation layer (not labeled) formed on the surface of the substrate 100, and a first conductive layer 101 formed in the insulation layer. The top surface of the first conductive layer 101 may level with the top surface of the insulation layer.

The semiconductor substrate may include any appropriate semiconductor materials, such as silicon, silicon on insulator (SOI), germanium on insulator (GOI), silicon germanium, carborundum, indium antimonite, lead telluride, indium arsenide, indium phosphide, gallium arsenide, gallium nitride, gallium antimonite, alloy semiconductor or a combination thereof. The semiconductor substrate provides a base for subsequent structures and processes.

The substrate 100 may also include a plurality of device structures formed on the surface of the semiconductor substrate. The device structures may include one or more of the gate structures of transistors, fuse structures, resistors, capacitors, or inductors, etc. The insulation layer may cover the device structures. The insulation layer may be made of any appropriate material, such as one or more of silicon oxide, silicon nitride, silicon oxynitride, low dielectric constant (low-K) material, and ultra-low-K material, etc.

Further, the substrate 100 may also include an electrical interconnect structure (not shown) formed on the surface of the semiconductor substrate and/or the surfaces of the device structures. The electrical interconnect structure may be used to form electrical interconnections between device structures. The electrical interconnect structure may be made of any metals and/or metal compounds, such as one of more of Cu, Wu, Al, Ni, Ti, TiN, or TaN, etc. The electrical interconnect structure may include conductive vias formed on the surface of the semiconductor substrate and/or the surfaces of the device structures, and the first conductive layer 101 formed on the top surfaces of the conductive vias, etc. The first conductive layer 101 may be used to electrically interconnect the conductive vias.

The first conductive layer 101 may be made of any appropriate material, such as Cu, W, Al, Ti, Ta, TiN, or TaN, etc. Various processes may be used to the form the first conductive layer 101, such as a chemical vapor deposition (CVD) process, a physical vapor deposition (PVD) process, a flowable CVD (FCVD) process, a sputtering process, or an electroplating process, etc.

Referring to FIG. 6, in one embodiment, a first diffusion barrier layer 102 may be formed between the first conductive layer 101 and the insulation layer and the semiconductor substrate. The first diffusion barrier layer 102 may be used to prevent the metal atoms in the first conductive layer 101 from diffusing into the substrate 100.

The first diffusion barrier layer 102 may be made of any appropriate material, such as Ta, or TaN, etc. In certain other embodiments, the first diffusion barrier layer 102 may be a stacked structure made of Ta and TaN. Various processes may be used to form the first diffusion barrier layer 102, such as a CVD process, a PVD process, or an FCVD process, etc.

Figure 7:
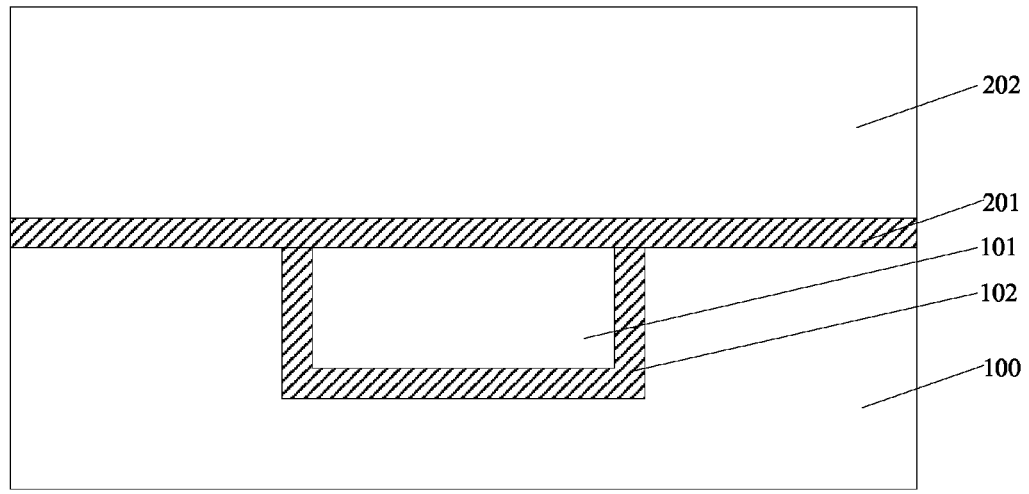

Returning to FIG. 17, after providing the substrate 100 and forming the first conductive layer 101, a first barrier layer and a sacrificial layer may be formed (S102). FIG. 7 illustrates a corresponding semiconductor structure.

As shown in FIG. 7, a first barrier layer 201 is formed on the surface of the substrate 100, the surface of the first conductive layer 101 and the surface of the first diffusion barrier layer 102. Further, a sacrificial layer 202 is formed on the surface of the first barrier layer 201. In certain other embodiments, the first barrier layer 201 may be omitted. Thus, the sacrificial layer 202 is directly formed on the surface of the substrate 100, the surface of the first conductive layer 101 and the surface of the first diffusion barrier layer 102.

The first barrier layer 201 may be used as an etching stop layer for subsequently etching the sacrificial layer 202. The first barrier layer 201 may be made of any appropriate material, such as SiN, or SiCN, etc. Various processes may be used to form the first barrier layer 201, such as a CVD process, a PVD process, or an atomic layer deposition (ALD) process, etc.

The sacrificial layer 202 may be made of any appropriate material which may be easy to remove by a wet etching process, such as photoresist, organic bottom anti-reflective material, or organic top anti-reflective material, etc. In one embodiment, the sacrificial layer 202 is made of photoresist; and a spin-coating process may be used to form the sacrificial layer 202.

Figure 8:
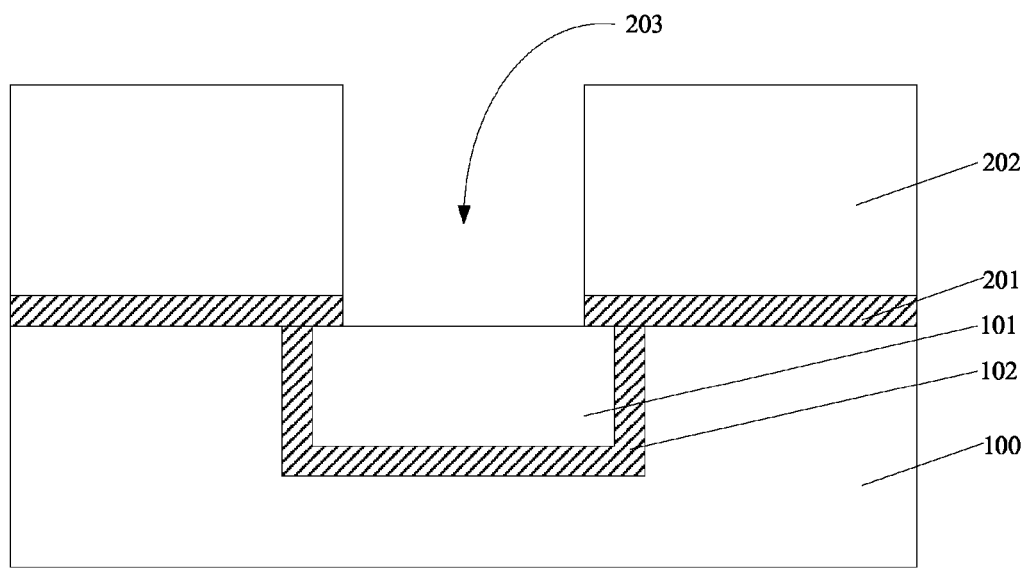

Returning to FIG. 17, after forming the sacrificial layer 202, an opening may be formed (S103). FIG. 8 illustrates a corresponding semiconductor structure.

As shown in FIG. 8, an opening 203 is formed in the sacrificial layer 202. The opening 203 may expose a portion of the surface of the substrate 100 and the surface of the first conductive layer 101. In one embodiment, the opening 203 exposes a portion of the surface of the first conductive layer 101. The opening 203 may be formed by etching the sacrificial layer 202 until the surface of the portion of the first conductive layer 101 is exposed.

In one embodiment, the sacrificial layer 202 is made of photoresist, the opening 203 may be formed by exposing and developing the photoresist layer to form a patterned photoresist layer. Then, the first barrier layer 201 may be etched using the patterned photoresist layer as an etching mask until the portion of the surface of first conductive layer 101 is exposed. Thus, the opening 203 may be formed.

In certain other embodiments, a method for forming the opening 203 may include sequentially forming a patterned photoresist layer on the surface of the sacrificial layer 202; and followed by etching the sacrificial layer 202 and the first barrier layer 201 using the patterned mask layer as an etching mask until the surface of the first conductive layer 101 is exposed. Thus, the opening 203 may be formed.

Referring to FIG. 8, in one embodiment, the width of the opening 203 may be smaller than the width of the first conductive layer 101. Such a width may cause a subsequently formed conductive structure in the opening 203 to be entirely on the surface of the first conductive layer 101.

Figure 9:
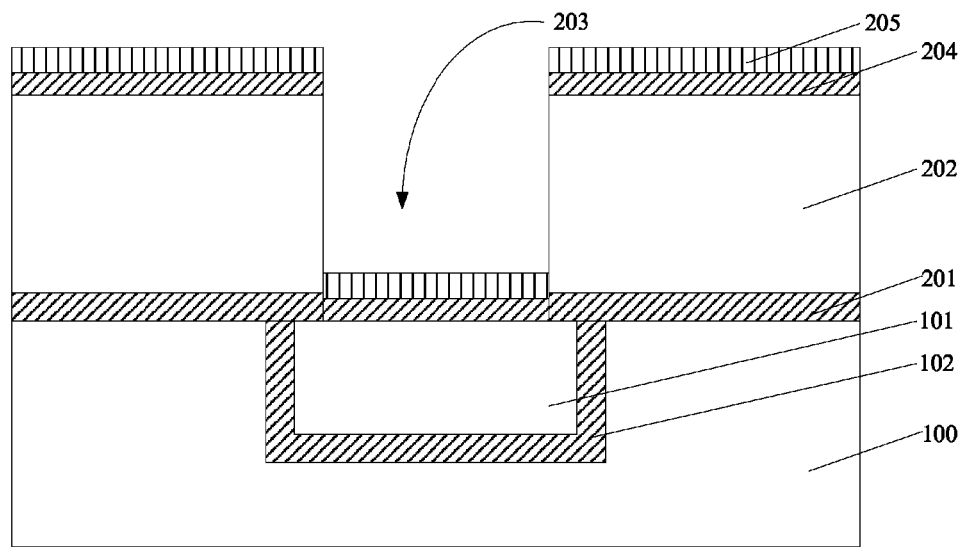

Returning to FIG. 17, after forming the opening 203, a second diffusion barrier layer and an electrical contact layer may be formed (S104). FIG. 9 illustrates a corresponding semiconductor structure.

As shown in FIG. 9, a second diffusion barrier layer 204 is formed on the portion of the first conductive layer 101 exposed by the opening 203, and the surface of the sacrificial layer 202. The second diffusion barrier layer 204 may block the atomic diffusion between the first conductive layer 101 and the subsequently formed carbon nanotube bundles. Further, an electrical contact layer 205 is formed on the surface of the second diffusion barrier layer 204. The electrical contact layer 205 may increase the conductive ability between the first conductive layer 101 and the subsequently formed carbon nanotube bundles. Thus, the contact resistance between the first conductive layer 101 and the carbon nanotube bundles may be reduced.

The second diffusion barrier layer 204 may be made of any appropriate material, such as Ta, or TaN, etc. The second diffusion barrier layer 204 may also be a stacked structure made of TaN and Ta. In one embodiment, the second diffusion barrier layer 204 is a stacked structure made of TaN and Ta.

The electrical contact layer 205 may be made of any appropriate material, such as Ti, or TiN, etc. In one embodiment, the electrical contact layer 205 is made of TiN.

Various processes may be used to form the second diffusion barrier layer 204 and the electrical contact layer 205, such as a CVD process, a PVD process, or an FCVD process, etc. In one embodiment, the second diffusion barrier layer 204 and the electrical contact layer 205 are formed by a sputtering process. Because the sputtering process may have a significantly high directivity, the second diffusion barrier layer 204 and the electrical contact layer 205 may only be formed on the bottom of the opening 203 and the surface of the sacrificial layer 202, and may not be formed on the side surface of the opening 203. Thus, it may avoid reducing the width of the opening 203. If the width of the opening 203 is reduced, it may increase the difficulty for subsequently forming carbon nanotube bundles in the opening 203. (may be not right, because sputtering process should have poor directivity)

In certain other embodiments, the second diffusion barrier layer 204 and the electrical contact layer 205 are formed by other appropriate methods; and the second diffusion barrier layer 204 and the electrical contact layer 205 may also cover the side surface of the opening 203. In certain other embodiments, the second diffusion barrier layer 204 and the electrical contact layer 205 may be omitted.

Figure 10:
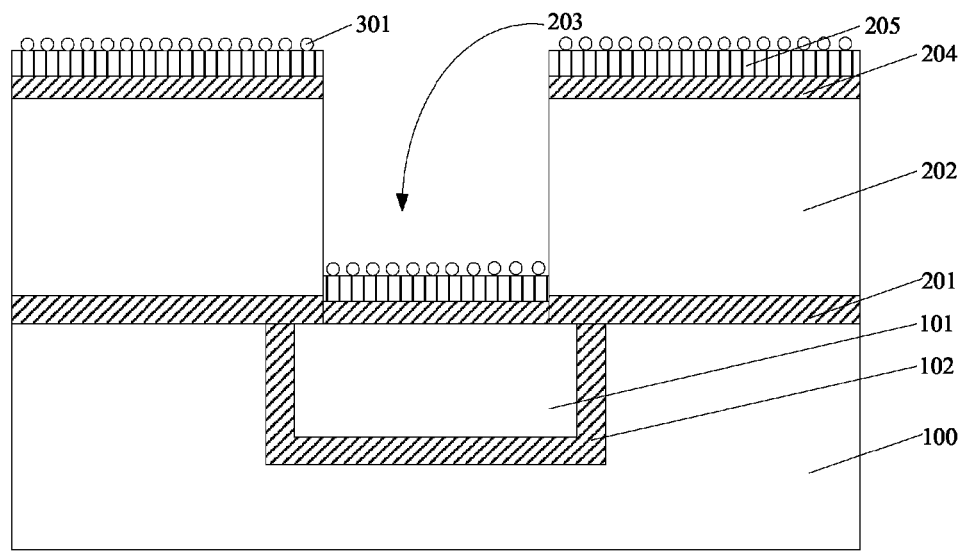

Returning to FIG. 17, after forming the second diffusion barrier layer 204 and the electrical contact layer 205, a catalyst layer may be formed (S105). FIG. 10 illustrates a corresponding semiconductor structure.

As shown in FIG. 10, a catalyst layer (not labeled) is formed on the surface of the electrical contact layer 205. If the second diffusion barrier layer 204 and the electrical contact layer 205 are omitted, the catalyst layer may be directly formed on the surface of the first conductive layer 101 at the bottom of the opening 203 and the surface of the sacrificial layer 202.

In one embodiment, the catalyst layer may include a plurality of discretely distributed metal particles 301. The diameter of the metal particles 301 may be smaller than approximately 10 nm. Because the diameter of the metal particles 301 may be substantially small and the specific surface area may be significantly large, the bond state and the electron state of the surface of the metal particles 301 may be different from the bond state and the electron state of the inner portion of the metal particles 301. Thus, the deficiency of the ligand atoms on the surface of the metal particles 301 may cause the active positions on the surface of the metal particles 301 to increase.

Thus, the metal particles 301 may have a significantly high catalytic property. In one embodiment, the diameter of the metal particles 301 may be in a range of approximately 1 nm~3 nm. The distance between adjacent metal particles 301 may be in a range of approximately 1 nm~5 nm. The size of the metal particles 301 may be substantially small, thus the metal particles 301 may have a significantly high catalytic property during the subsequent process for forming the carbon nanotube bundles.

The metal particles 301 may be made of any appropriate metal, such as one or more of Cu, Ag, Co, Fe, or Ni, etc. In one embodiment, the metal particles 301 are made of Co.

A method for forming the metal particles 301 on the surface of the electrical contact layer 205 exposed by the opening 203 and the surface of the sacrificial layer 202 may include forming the metal particles 301 by a laser ablation process; dispersing the metal particles 301 in a solution; spin-coating the solution having the metal particles 301 on the surface of the electrical contact layer 205; and baking the solution on the electrical contact layer 205 to evaporate the solvent. Thus, the metal particles 301 may be dispersed on the electrical contact layer 205 exposed by the opening 203.

In one embodiment, a method for forming the metal particles 301 by a laser ablation process may include ablating a bulk or a thin film target made of the material of the metal particles 301 using a pulse laser; and the metal particles 301 may be formed. The energy density of the pulse laser may be in a range of approximately 3 J/cm$^2$~10 J/cm$^2$. The frequency of the pulse laser may be in a range of approximately 8 Hz~12 Hz.

The metal particles 301 formed by the laser ablation process may be dispersed in de-ionized water, or other appropriate solvent to form the solution having the metal particles 301. In certain other embodiments, the metal target may be directly disposed in the solution; and then the metal target may be ablated in the solution using a pulse laser. Thus, the formed metal particles 301 may be directly dispersed in the solution. In certain other embodiments, the metal particles 301 may be formed by other appropriate wet chemical methods.

In certain other embodiments, the metal nanoparticles 301 may be screened to select the metal particles with a uniform size distribution; and then dispersed in the solution. Thus, the metal particles 301 of the catalyst layer may have the uniform size distribution, and the catalytic property of the catalyst layer may be uniform.

After spin-coating the solution with the dispersed metal particles 301 on the surface of the electrical contact layer 205, a baking process may be performed. The baking process may evaporate the solvent in the solution spin-coated on the surface of the electrical contact layer 205. The baking process may also be able to further increase the adhesion between the metal particles 301 and the electrical contact layer 205, thus it may prevent the metal particles 301 from peeling off during the subsequent processes.

The baking process may be performed in a protective gas environment in which the metal particles 301 may not react with the protective gas. The protective gas may be $H_2$, $N_2$, or inert gas, etc. The baking process may also be performed under vacuum. The protective gas environment or vacuum may prevent reactions on the surface of the metal particles 301 during the baking process. The reactions may change the properties of the metal particles 301.

In certain other embodiments, the catalyst layer may be a metal thin film. The metal thin film may be formed by any appropriate process, such as a CVD process, a PVD process, an FCVD process, or a sputtering process. In one embodiment, the catalyst layer with a metal thin film mode is formed by a sputtering process. The thickness of the catalyst layer (metal thin film) may be smaller than approximately 10 nm.

Figure 11:
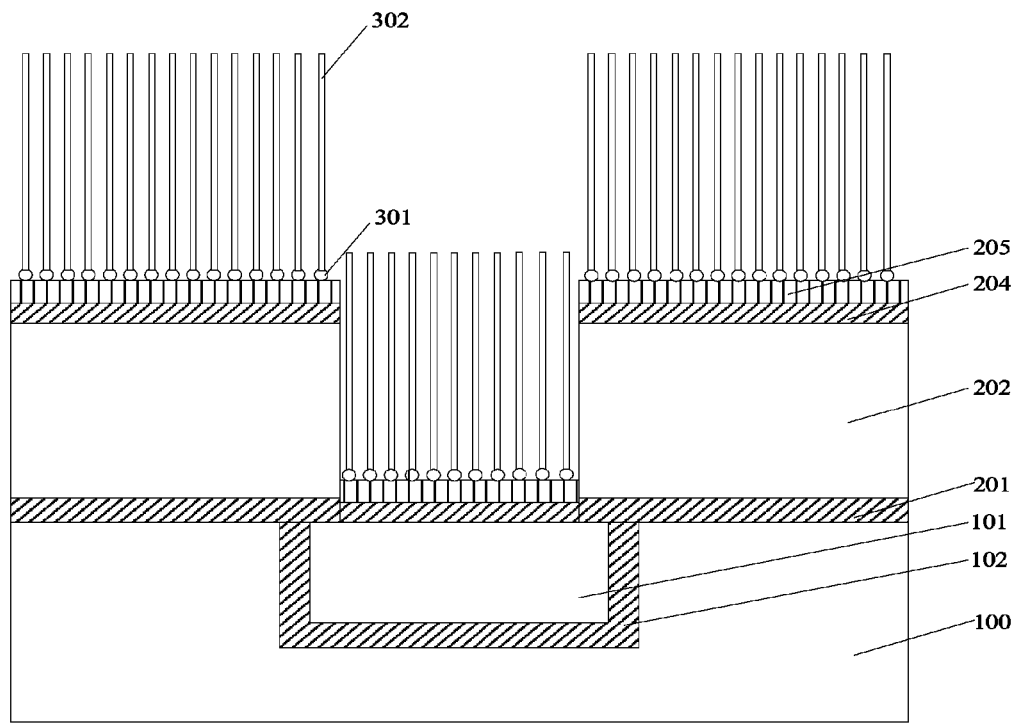

Returning to FIG. 17, after forming the catalyst layer, carbon nanotube bundles may be formed (S106). FIG. 11 illustrates a corresponding semiconductor structure.

As shown in FIG. 11, carbon nanotube bundles (not labeled) are formed on the surface of the catalyst layer. The carbon nanotube bundles may include a plurality of discrete carbon nanotubes 302. The carbon nanotube bundles may be perpendicular to the surface of the substrate 100. The carbon nanotubes 302 may be single-wall nanotubes, or multi-wall carbon nanotubes.

Various processes may be used to form the carbon nanotubes 302, such as a CVD process, an arc discharging process, a laser ablation process, or a high pressure carbon monoxide reaction process, etc. In one embodiment, the carbon nanotubes 302 are formed by a plasma-enhanced vapor deposition (PECVD) process. The reaction gas of the PECVD process for forming the carbon nanotubes 302 may be $CH_4$, $C_2H_4$, or $C_2H_2$, etc. The carrier gas may be $H_2$, etc. The flow rate of the reaction gas may be in a range of approximately 50 sccm~1000 sccm. The reaction temperature of the PECVD process may be in a range of approximately 400° C.~1000° C. The catalyst layer may have the catalytic function during the process for forming the carbon nanotubes 302; and the carbon nanotubes 302 may be formed on the metal particles 301.

The diameter of the carbon nanotubes 302 may be in a range of approximately 1 nm~10 nm. The lengths of the carbon nanotubes 302 may be determined by the height of the vertical interconnect structure. In one embodiment, the lengths of the carbon nanotubes 302 may be in a range of approximately 50 nm~500 nm. In one embodiment, the height (length along the vertical direction) of the carbon nanotubes 302 may be greater than the depth of the opening 203. Further, the two side surfaces of the opening 203 may be the side surfaces of the sacrificial layer 202, the opening 203 may limit the growth of the carbon nanotubes 302 along the lateral direction during the formation of the carbon nanotubes 302. Thus, the carbon nanotubes 302 formed in the opening 203 may only grow along the direction perpendicular to the substrate 100; and the carbon nanotube bundles may have a desired morphology.

Because the diameter of the carbon nanotubes 302 may be substantially small; and the specific surface area may be significantly large, carriers may have a ballistic transfer in the carbon nanotubes 302; and the carriers may not be affected by the scattering effect during a transfer process. Thus, the carbon nanotubes 302 may have a significantly high carrier mobility, and current carrying mobility. The interconnect structure having such carbon nanotubes may not have an electromigration issue, and/or other related issues. Thus, the reliability of the interconnect structure may be improved.

Figure 12:
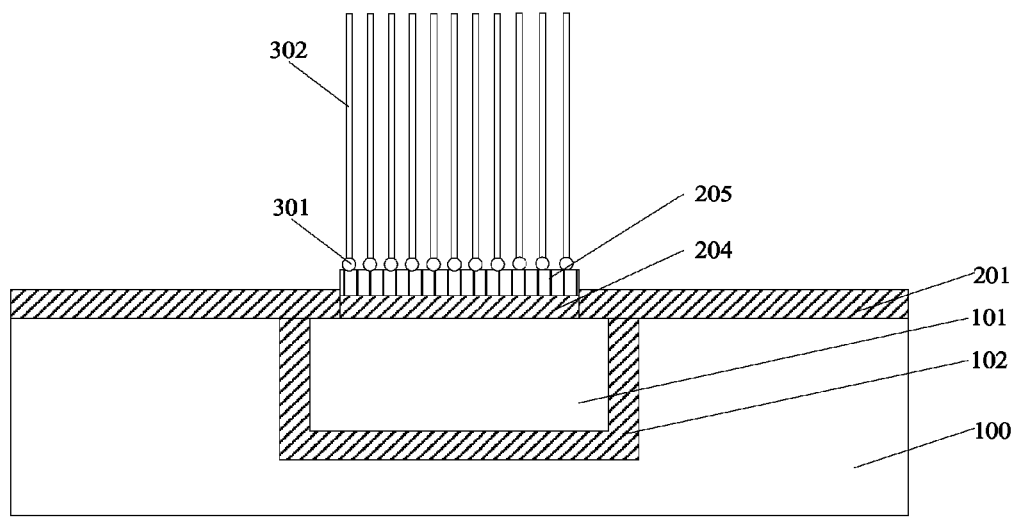

Returning to FIG. 17, after forming the carbon nanotube bundles, a portion of the catalyst layer, a portion of the carbon nanotube bundles, and the sacrificial layer 202 may be removed (S107). FIG. 12 illustrates a corresponding semiconductor structure.

As shown in FIG. 12, the sacrificial layer 202 is removed. A portion of the catalyst layer and a portion of the carbon nanotube bundles on the surface of the sacrificial layer 202 are also removed. In one embodiment, the sacrificial layer 202 may be made of photoresist, the sacrificial layer 202 may be removed by developing and the cleaning the sacrificial layer 202. In certain other embodiments, the sacrificial layer 202 may be removed by any appropriate process according to the material of the sacrificial layer 202.

Referring to FIGS. 11~12, when the sacrificial layer 202 is being removed, the second diffusion barrier layer 204, the electrical contact layer 205, the catalyst layer and the carbon nanotubes 302 on the sacrificial layer 202 may be removed simultaneously, because the supporting of the sacrificial layer 202 is lost. Thus, only the portions of the barrier layer 204, the electrical contact layer 205 and the carbon nanotube bundles (carbon nanotubes 302) on the surface of the first conductive layer 101 may be kept. The carbon nanotubes 302 may electrically contact with the first conductive layer 101.

After removing the sacrificial layer 202, both sides of the carbon nanotube bundles may not be blocked, thus it may be easy to remove the etching solution and other contaminations. Thus, the residual contaminations may not be formed between carbon nanotubes 302; and the performance of the interconnect structure having the carbon nanotube bundles may be improved.

Figure 13:
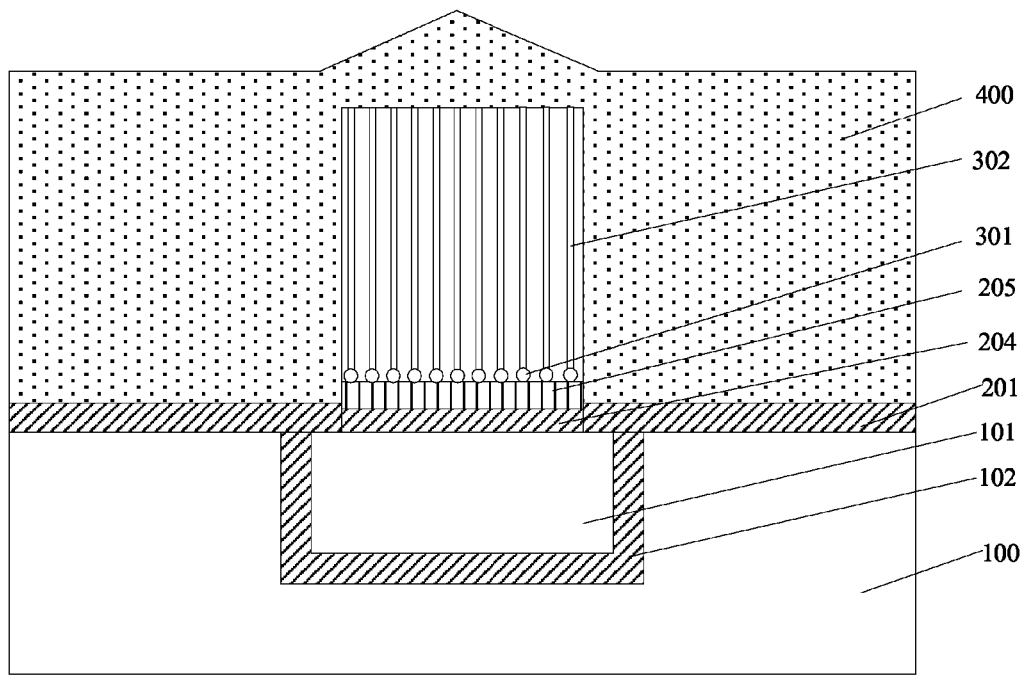

Returning to FIG. 17, after removing the sacrificial layer 202 and the carbon nanotubes 302 on the sacrificial layer 202, a first dielectric material layer may be formed (S108). FIG. 13 illustrates a corresponding semiconductor structure.

As shown in FIG. 13, a first dielectric material layer 400 is formed on the surface of the first surface of the first barrier layer 201. The first dielectric material layer 400 may also cover the top surfaces of the carbon nanotubes 302. In certain other embodiments, if the first barrier layer 201 is omitted, the first dielectric layer 400 may be formed on the substrate 100 directly. The surface of the portion of the first dielectric layer 400 on the top surfaces of the carbon nanotubes 302 may be higher the surfaces of other portions of the first dielectric layer 400. The first dielectric material layer 400 may be used to subsequently form a first dielectric layer.

The first dielectric material layer 400 may be made of any appropriate material, such as silicon oxide, silicon nitride, silicon oxynitride, low-K dielectric material (such as porous silicon oxide, or porous silicon nitride, etc.), or ultra-low-K dielectric material (such as porous SiCOH, etc.), etc. In one embodiment, the first dielectric layer 400 is made of porous SiCOH. Because SiCOH is an ultra-low-K dielectric material, the first dielectric material layer 400 made of SiCOH may have a significantly high insulation ability. Further, the ultra-low-K SiCOH may be able to further lower the parasitic capacitance of the interconnect structure. Thus, the reliability of the interconnect structure may be improved.

Various processes may be used to form the first dielectric material layer 400, such as a CVD process, a PVD process, an FCVD process, or an ALD process, etc. In one embodiment, the first dielectric material layer 400 is formed by a PECVD process.

The reaction gas of the PECVD process may include $[(CH_3)_2SiO]_5$ (DMCPS) and $CHF_3$, etc. Because the distance between adjacent carbon nanotubes 302 may be significantly small, the reaction gas may be difficult to enter in between the adjacent carbon nanotubes 302. Thus, the first dielectric material layer 400 may be formed on the surface of the first barrier layer 201 and the top and the side surfaces of the nanotube bundles; and may be able to seal the gaps between the adjacent carbon nanotubes 302. The first dielectric material layer 400 may not be formed between the adjacent carbon nanotubes 302. Thus, the possible electrical property change of the carbon nanotubes 302 caused by the first dielectric material layer 400 may be avoided.

Figure 14:
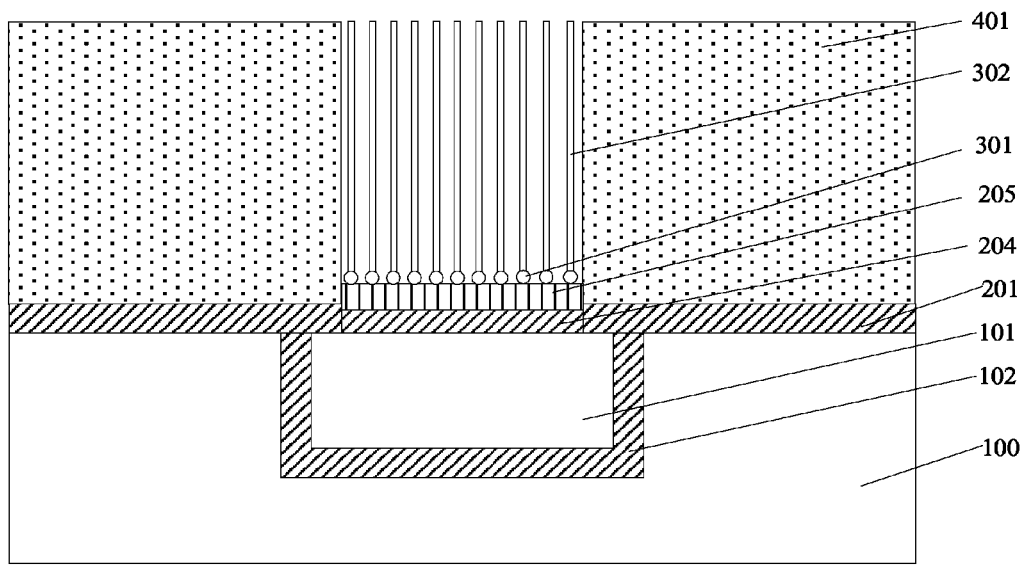

Returning to FIG. 17, after forming the first dielectric material layer 400, a planarization process may be performed on the first dielectric material layer 400 (S109). FIG. 14 illustrates a corresponding semiconductor structure.

As shown in FIG. 14, a first dielectric layer 401 is formed by planarizing the first dielectric material layer 400. The top surface of the first dielectric layer 401 may level with the top surfaces of the carbon nanotubes 302.

The first dielectric material layer 400 may be planarized by any appropriate process, such as a physical mechanical polishing process, a chemical mechanical polishing (CMP) process, or an ion beam polishing process, etc. In one embodiment, the first dielectric material layer 400 is planarized by a CMP process to form the first dielectric layer 401. The top surfaces of the carbon nanotubes 302 may be used as a stop of the CMP process. Because the side surfaces and the top surfaces of the carbon nanotubes 302 may be covered by the first dielectric material layer 400 during the CMP process, the carbon nanotubes 302 may be in a sealed space. Thus, the polishing slurry may be unable to enter in between the carbon nanotubes 302.

When the top surfaces of the carbon nanotubes 302 are exposed, the CMP process may be stopped, the polishing slurry may not enter in between adjacent carbon nanotubes 302 anymore to contaminate the carbon nanotubes 302. Thus, the properties of the carbon nanotubes 302 may not be affected. Even there may be an overly polishing after stopping the CMP process; and a substantially small amount of the polishing slurry may enter in between the adjacent carbon nanotubes 302, the contaminations may have a substantially small effect onto the interconnect structure.

Further, during the CMP process, the carbon nanotubes 302 may be covered by the first dielectric material layer 400, the mechanical force applied onto the carbon nanotubes 302 may be substantially small. Such a small mechanical force may not cause the bottom of the carbon nanotubes 302 to be peeled off from the electrical contact layer 205. Thus, it may ensure the bottom of the carbon nanotubes 302 to have a desired electrical connection with the electrical contact layer 205.

Returning to FIG. 17, after forming the first dielectric layer 401, a second barrier layer and a second dielectric layer may be formed (S110). FIG. 15 illustrates a corresponding semiconductor structure.

As shown in FIG. 15, a second barrier layer 501 is formed on the first dielectric layer 401 and the carbon nanotube bundles. Further, a second dielectric layer 502 is formed on the second barrier layer 501. The second barrier 501 may be used as a stop layer for subsequently etching the second dielectric layer 502.

The second barrier layer 501 may be made of any appropriate material, such as silicon oxide, silicon nitride, or silicon oxynitride, etc. Various processes may be used to form the second barrier layer 501, such as a CVD process, a PVD process, an FCVD process, or an ALD process, etc.

The second dielectric layer 502 may be made of any appropriate material, such a silicon oxide, silicon nitride, silicon oxynitride, low-K dielectric material (such as porous silicon oxide, or porous silicon nitride, etc.), or ultra-low-K dielectric material (such as porous SiCOH, etc.), etc. Various processes may be used to form the second dielectric layer 502, such as a CVD process, a PVD process, an FCVD process, or an ALD process, etc. In one embodiment, the second dielectric layer 502 is made of porous SiCOH. Because the porous SiCOH may have an ultra-low dielectric constant, the second dielectric layer 502 may have a significantly high insulating ability. Thus, the second dielectric layer 502 made of SiCOH may be able to further lower the parasitic capacitance; and the reliability of the interconnect structure may be increased.

Returning to FIG. 17, after forming the second dielectric layer 502, a second conductive layer and a third diffusion barrier layer may be formed (S111). FIG. 16 illustrates a corresponding semiconductor structure.

As shown in FIG. 16, a third diffusion barrier layer 503 is formed on the carbon nanotube bundles and a portion of the first dielectric layer 401. Further, a second conductive layer 504 is formed on the third diffusion barrier layer 503 in the second dielectric layer 502. The second conductive layer 504 may electrically contact with the top surfaces of the carbon nanotubes 302. The third diffusion barrier layer 503 may prevent the metal atoms of the second conductive layer 504 from diffusing into the carbon nanotubes 302.

A process for forming the second conductive layer 504 and the third diffusion barrier layer 503 may include forming an opening (not labeled) exposing the top surfaces of the carbon nanotubes 302 and a portion of the top surface of the first dielectric layer 401 at both sides of the carbon nanotube bundles in the second dielectric layer 502; forming the third diffusion barrier layer 503 on the top surfaces of the carbon nanotubes 302, the portion of the top surface of the first dielectric layer 401, and the side surface of the opening; and forming the second conductive layer 504 on the third diffusion barrier layer 503. In certain other embodiments, the third diffusion barrier layer 503 may be omitted. Thus, the second conductive layer 504 may be directly formed on the top surfaces of the carbon nanotubes 302, the portion of the top surface of the first dielectric layer 401, and the side surface of the opening.

The third diffusion barrier layer 503 may be made of any appropriate material, such as Ta or TaN, etc. The third diffusion barrier layer 503 may be also be a stacked structure made of Ta and TaN, etc. The third diffusion barrier layer 503 may prevent the metal atoms in the second conductive layer 504 from diffusing into the carbon nanotubes 302. Thus, the effect to the properties of the carbon nanotubes 302 may be avoided. Further, the third diffusion barrier layer 503 may be able to increase the electrical contacting properties between the second conductive layer 504 and the carbon nanotubes 302. Thus, the contact resistance between the second conductive layer 504 and the carbon nanotubes 302 may be reduced. Various processes may be used to form the third diffusion barrier layer 503, such as a CVD process, a PVD process, an FCVD process, or an ALD process, etc.

Referring to FIG. 16, the first conductive layer 101 and the second conductive layer 504 may be electrically connected by the carbon nanotubes 302. Because the carbon nanotubes 302 may be able to carry a significantly high current density, the interconnect ability between the first conductive layer 101 and the second conductive layer 504 may be improved. Thus, the reliability of the interconnect structure may be improved.

Thus, an interconnect structure may be formed by the above disclosed processes and methods; and a corresponding interconnect structure is illustrated in FIG. 16. As shown in FIG. 16, the interconnect structure includes a substrate 100 having a first diffusion barrier layer 102 and a first conductive layer 101. The top surface of the first conductive layer 101 levels with the top surface of the substrate 100. The interconnect structure also includes a second diffusion barrier layer 204 formed on the surface of the first conductive layer 101 and an electrical contact layer 205 formed on the second diffusion barrier layer 204. Further, the interconnect structure includes a catalyst layer having a plurality of metal particles 301 formed on the electrical contact layer 205 and carbon nanotube bundles having carbon nanotubes 302 formed on the catalyst layer. Further, the interconnect structure also includes a first barrier layer 201 covering the side surface of the second diffusion barrier layer 204 and portions of the top surfaces of the substrate 100 and the first conductive layer 101 and a first dielectric layer 401 covering the side surfaces of the carbon nanotube bundles and the top surface of the first barrier layer 201. Further, the interconnect structure also includes a third diffusion barrier layer 503 formed on the top surfaces of the carbon nanotubes 302 and a second conductive layer 504 formed on the third diffusion barrier layer 503. Further, the interconnect structure also includes a second barrier layer 501 covering a portion of the top surface of the first dielectric layer 401 and the side surface of the third diffusion barrier layer 503 and a second dielectric layer 502 formed on the second barrier layer 501. The detailed structures and intermediate structures are described above with respect to the fabrication processes.

Therefore, according to the disclosed methods and device structures, a first dielectric material layer may be formed on the side surfaces and the top surface of the carbon nanotube bundles. When the first dielectric material is planarized to form a first dielectric layer, because the carbon nanotube bundles may be in a sealed space, the polishing slurry of the planarization process may not enter in between the adjacent carbon nanotubes. Further, when the planarization process is stopped, no polishing slurry may subsequently enter in between adjacent carbon nanotubes to contaminate the carbon nanotubes. Thus, it may ensure the properties of the carbon nanotubes not to be affected. Further, the first dielectric material layer may cover the top surfaces of the carbon nanotubes during the first planarization process. Thus, the mechanical force applied on the carbon nanotubes caused by the first planarization process may be significantly small. Thus, the significantly small force may not peel off the carbon nanotubes from the electrical contact layer. Therefore, a desired electrical connect properties between the bottoms of the carbon nanotubes and the electrical contact layer may be ensured.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating an interconnect structure, comprising:

forming a first conductive layer within a substrate and having a coplanar surface with the substrate;

forming a sacrificial layer on the substrate and the first conductive layer, the sacrificial layer being made of one of a photoresist, an organic bottom anti-reflective material, and an organic top anti-reflective material;

forming an opening in the sacrificial layer to expose a surface portion of the first conductive layer;

forming carbon nanotube bundles on the sacrificial layer and on the surface portion of the first conductive layer;

removing the sacrificial layer and the carbon nanotube bundles on the sacrificial layer simultaneously to leave the carbon nanotube bundle on the surface portion of the first conductive layer and to expose surface portions of the substrate; and forming a first dielectric material layer covering to seal a top surface of the carbon nanotube bundle on the surface portion of the first conductive layer and on the exposed surface portions of the substrate to seal side surfaces of the carbon nanotube bundle in a space.

2. The method according to claim 1, after forming the first dielectric material layer, further including:
performing a planarization process on the first dielectric material layer using the top surface of the carbon nanotube bundle as a stop layer to form a first dielectric layer with a top surface leveled with the top surface of the carbon nanotube bundle.

3. The method according to claim 2, after performing the planarization process, further including:
forming a second dielectric layer on the top surface of the carbon nanotube bundle and a top surface of the first dielectric layer; and
forming a second conductive layer electrically contacting with the top surface of the carbon nanotube bundle in the second dielectric layer.

4. The method according to claim 1, further including:
forming a catalyst layer on the sacrificial layer and on the surface portion of the first conductive layer exposed by the sacrificial layer, wherein:
the carbon nanotube bundles are formed from the catalyst layer;
the catalyst layer includes dispersed metal particles; and
the particles are made of Au, Ag, Cu, Fe, Co, or Ni.

5. The method according to claim 4, wherein:
a diameter of the metal particles is smaller than approximately 10 nm; and
a distance between adjacent metal particles is in a range of approximately 1 nm~5 nm.

6. The method according to claim 4, wherein forming the catalyst layer further includes:
forming the metal particles by a laser ablation process;
dispersing the metal particles in a solution;
spin-coating the dispersed metal particles in the solution on the exposed surface portion of the first conductive layer at a bottom of the opening and a top surface of the sacrificial layer; and
performing a baking process to evaporate solvent in the solution spin-coated on the first conductive layer.

7. The method according to claim 6, wherein:
a metal bulk or a metal film is used as a target of the laser ablation process;
a pulse laser is used to ablate the target to form the metal particles;
a power density of the pulse laser is in a range of approximately 3 J/cm$^2$~10 J/cm$^2$; and
a frequency of the pulse laser is in a range of approximately 8 Hz~12 Hz.

8. The method according to claim 6, after forming the metal particles, further including:
screening the metal particles to obtain metal particles with a uniform size distribution; and
dispersing the metal particles with the uniform size distribution in the solution.

9. The method according to claim 1, wherein:
the carbon nanotube bundles are formed by a plasma-enhanced chemical vapor deposition process.

10. The method according to claim 9, wherein:
a reaction gas of the plasma-enhanced chemical vapor deposition process includes $CH_4$, $C_2H_6$, $C_2H_4$, or $C_2H_2$;
a carrier gas of the reaction gas is $H_2$;
a flow rate of the reaction gas is in a range of approximately 5 sccm~100 sccm;
a flow rate of $H_2$ is in a range of approximately 50 sccm~1000 sccm; and
a reaction temperature of the plasma-enhanced chemical vapor deposition process is in a range of approximately 400° C.~1000° C.

11. The method according to claim 10, wherein:
a diameter of an individual carbon nanotube of the carbon nanotube bundles is in a range of approximately 1 nm~10 nm.

12. The method according to claim 1, wherein forming the first dielectric layer further includes:
forming a first dielectric material layer covering a surface of the substrate and the carbon nanotube bundle formed within the opening; and
performing a chemical mechanical polishing process on the first dielectric material layer using the top surfaces of the carbon nanotubes of the carbon nanotube bundle as a stop layer.

13. The method according to claim 1, after forming the opening, further including:
forming a diffusion barrier layer on the exposed surface portion of the first conductive layer at the bottom of the opening and the top surface of the sacrificial layer; and
forming an electrical contact layer on the diffusion barrier layer, wherein the carbon nanotube bundles are formed on the electrical contact layer.

14. The method according to claim 13, wherein:
the diffusion barrier layer and the electrical contact layer are formed by a sputtering process.

15. The method according to claim 1, before forming the second dielectric layer, further including:
forming a second barrier layer on the first dielectric layer and the top surfaces of the carbon nanotube bundles.

16. The method according to claim 1, wherein:
the first dielectric layer is made of an ultra-low dielectric constant material.

17. The method according to claim 13, wherein:
the diffusion barrier layer is a stacked structure made of Ta and TaN; and
the electrical contact layer is made of TiN.

* * * * *